(12) United States Patent
Sywyk et al.

(10) Patent No.: US 6,647,457 B1
(45) Date of Patent: Nov. 11, 2003

(54) CONTENT ADDRESSABLE MEMORY HAVING PRIORITIZATION OF UNOCCUPIED ENTRIES

(75) Inventors: Stefan P. Sywyk, San Jose, CA (US); Eric H. Voelkel, Ben Lomond, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/440,682

(22) Filed: Nov. 16, 1999

(51) Int. Cl.[7] .............................................. G06F 12/00
(52) U.S. Cl. ........................ 711/108; 711/128; 711/158; 365/49; 365/189.07
(58) Field of Search .............................. 711/108, 128, 711/158, 5; 365/49, 189.07

(56) References Cited

U.S. PATENT DOCUMENTS

| | | | |
|---|---|---|---|
| 4,910,668 A | * 3/1990 | Okamoto et al. ............ 711/207 |
| 4,928,260 A | 5/1990 | Chuang et al. | |
| 4,975,873 A | 12/1990 | Nakabayashi et al. | |
| 5,072,422 A | 12/1991 | Rachels | |
| 5,265,258 A | 11/1993 | Fiene et al. | |
| 5,440,715 A | * 8/1995 | Wyland ....................... 711/108 |
| 5,454,094 A | 9/1995 | Montove | |
| 5,946,704 A | * 8/1999 | Yoneda et al. ............... 711/108 |
| 5,999,434 A | * 12/1999 | Yoneda et al. ................ 365/49 |
| 6,081,440 A | * 6/2000 | Washburn et al. ............ 365/49 |
| 6,148,364 A | * 11/2000 | Srinivasan et al. ......... 711/108 |
| 6,199,140 B1 | * 3/2001 | Srinivasan et al. ......... 711/108 |

* cited by examiner

Primary Examiner—Donald Sparks
Assistant Examiner—Jasmine Song
(74) Attorney, Agent, or Firm—Bradley T. Sako

(57) ABSTRACT

According to one embodiment, a content addressable memory (CAM) (100) can include a number of CAM entries (102-0 to 102-n) and corresponding status stores (106-0 and 106-n). Match indications from the CAM entries (102-0 to 102-n) and status information from status stores (106-0 and 106-n) can be supplied to a switching circuit (108). Status information can indicate if an entry stores valid or invalid data. In one mode of operation, the switching circuit (108) can provide match indication values on a number of switch outputs (SW0 to SWn). In another mode of operation, the switching circuit (108) can provide status information on a number of switch outputs (SW0 to SWn).

18 Claims, 4 Drawing Sheets

CONTENT ADDRESSABLE MEMORY HAVING PRIORITIZATION OF UNOCCUPIED ENTRIES

TECHNICAL FIELD

The present invention relates generally to content addressable memories (CAMs) and more particularly to CAMs having indicators for showing when an entry is occupied or unoccupied.

BACKGROUND OF THE INVENTION

Due to the increasing importance of data networks, including the Internet, the prevalence of content addressable memories (CAMs) has continued to proliferate. CAMs, also referred to as "associative memories," can provide rapid matching functions that are often needed in certain packet processing hardware devices, such as routers and network switches, to name just two. In a typical packet processing operation, a device can receive a packet. The packet can include a "header" that includes various data fields that indicate how the packet should be processed. The device can use a matching function, provided by a CAM, to compare one or more header fields to "look-up" tables stored in the CAMs.

As just one example, a router can use a matching function to match the destination of an incoming packet with a "forwarding" table. The forwarding table can provide "nexthop" information that can allow the incoming packet to be transmitted to its final destination, or to another node on the way to its final destination.

The look-up tables in packet processing devices (which are typically stored in a CAM) are rarely static. That is, the entries with such a table may be constantly updated with different information. This may be particularly true in routers, which can update forwarding tables thousands of times a second.

A typical CAM can store the data values of a look-up table in one or more CAM cell arrays. The CAM cell arrays can be configured into a number of entries, each of which can provide a match indication. In a compare (i.e., match) operation, the data values stored within the entries can be compared to a comparand value (also referred to as a "search key"). In a typical packet processing device, the comparand value can include a field extracted from a data packet header. If a data value matches an applied comparand value, the corresponding entry can generate an active match indication. If a data value does not match an applied comparand value, the corresponding entry can generate an inactive match indication (signifying a "mismatch") condition.

Because the data values within a CAM may be continuously updated, some conventional CAMs can include a "status" bit (sometimes referred to as a "valid/invalid" or "occupied/unoccupied" bit). A status bit can be stored in one or more CAM cells in an entry. A status bit can have a "valid" logic state that can indicate an entry that stores usable data. A status bit can also have an "invalid" logic state that can indicate that the data stored within contains data that should no longer be used in a compare operation.

The use of a valid/invalid bit may be best understood by an example. Referring now to FIG. 8, an example of a CAM having entries with status bits is set forth in a table form. The CAM is designated by the general reference character 800, and is shown to include eight entries, labeled 0 to 7. Each entry can include 68 bits, labeled "C" to 67. Bit 0 (the "C" bit) can be a status bit. Also shown in FIG. 8 is a 68-bit comparand value. Each entry can generate a match indication in response to the application of a comparand value.

For many CAM applications it can be desirable to have entries arranged with a predetermined priority. In the event two or more match indications are activated in response to an applied comparand value, one of the match indications can be selected according to the location of its corresponding entry. As just one example, in the particular arrangement of FIG. 8, lower numbered entries can have priority over higher numbered entries. Thus, if the application of a comparand value resulted in entries 1 and 4 both activating a match indication, the match indication of entry 1 would have priority over that of entry 4.

In the particular example of FIG. 8, bit 0 is a status bit. When the status bit is "1", the entry is "valid" (or occupied), and thus stores data that can be compared with a comparand value. When the status bit is "0", the entry is "invalid" (or unoccupied), and thus stores data that should not be compared with a comparand value. To prevent an invalid entry from generating a possibly erroneous active match indication, the bit 0 of all applied comparands is set to "1." In this way, all invalid entries can be forced to generate a mismatch indication in response to a comparand value.

Thus, in the particular arrangement of FIG. 8, entries 2, 3 and 6 will generate a mismatch indication regardless of what other data values are stored within the entries.

In a table update operation, various operations can occur within a CAM. Existing "valid" data values may be placed into an invalid state by writing into at least the status bit and changing it from a valid to an invalid state. In addition, new data values may be written into available entries. Available entries can be those entries with "invalid" status bits.

In many applications, it can be desirable to write new data values into the "next free" entry. A next free entry can be the lowest number entry that is invalid. In the particular arrangement of FIG. 8, entry 2 can be considered the next free entry.

One way to write data into a "next free" entry is to employ duplicate storage registers to maintain a record of which entries are valid (such as a "shadow register"). A lowest entry number can then be determined from these values. The next free location can then be used as a write address for a subsequent data value write.

Approaches that utilize duplicate storage registers can have a number of drawbacks. Testing may become more complicated as data stored in the entry and the data in duplicate registers must both be tested to ensure that they both store the same data.

Approaches with "shadow registers" can also result in defective operation if either the entries or the duplicate registers contain a defect. Still further, such approaches can consume additional area on an integrated circuit, in addition to the area consumed by the registers themselves. Still further, additional circuitry can be included to write data into and read data out of the duplicate registers as well as ancillary support circuitry. Still further, other circuitry may be included to select the next free location from the shadow register information.

It would be desirable to arrive at some way of identifying a next free location in a CAM that is less complicated and/or consumes less circuit area than other conventional approaches.

SUMMARY OF THE INVENTION

According to disclosed embodiments, a content addressable memory (CAM) includes a number of entries that can store data values. In response to an applied comparand value, each entry can generate a match indication. The match indications can be received by a priority encoder that can select and output the address of one active match indication from multiple active match indications. Each entry can also include associated status data. Status data can indicate whether the data stored within an entry is valid or not. The priority encoder can further receive status data, and select a next free address location from the status data.

According to one aspect of the embodiments, a CAM can include a number of entries that each provide a match indication and include a CAM cell that stores status data. Match indications and status data from the CAM cells can be applied to the same priority encoder.

According to another aspect of the embodiments, a CAM can include a switch circuit that couples either match indications or status data to a priority encoder. In response to match indication, the priority encoder can generate a highest priority match indication which is output as an address. In response to status data, the priority encoder can generate a next free address. According to another aspect, a switch circuit can include multiplexer circuits.

According to another aspect of the embodiments, a CAM can automatically provide a next free address following a data write to an entry.

An advantage of the disclosed embodiments is that a CAM can provide a next free address without having to include duplicate storage registers.

An advantage of the disclosed embodiments is that a CAM that provides a next free address can be more compact than conventional approaches.

DETAILED DESCRIPTION OF THE EMBODIMENTS

Figure 1:
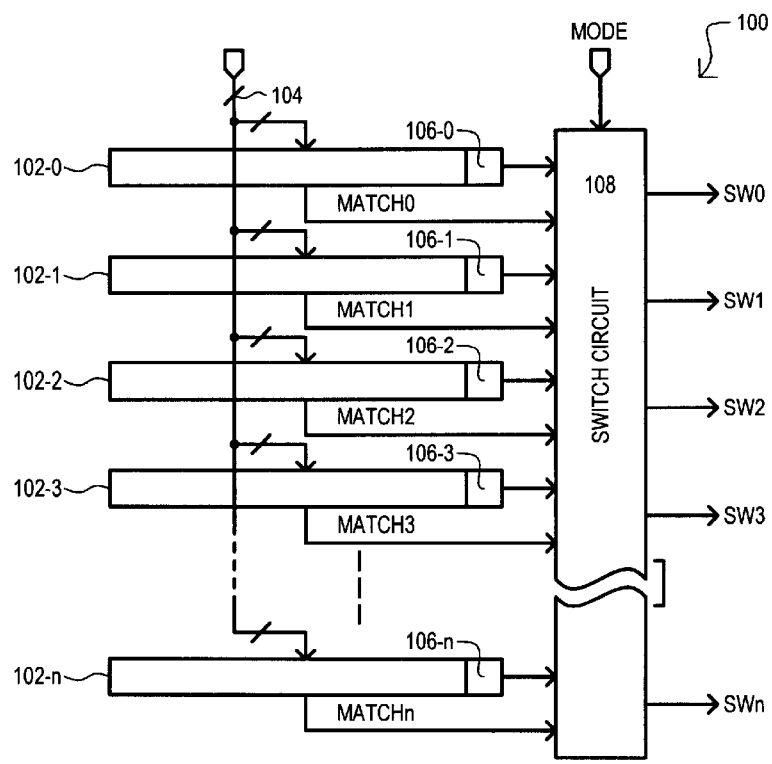
FIG. 1 is a block schematic diagram of a first embodiment.

Various embodiments will now be discussed in conjunction with a number of figures. Referring now to FIG. 1, a content addressable memory (CAM) according to a first embodiment is set forth in a block schematic diagram and designated by the general reference character 100. The first embodiment 100 is shown to include a number of CAM entries shown as 102-0 to 102-n.

Each CAM entry (102-0 to 102-n) can store a data value that may be compared to a comparand value. In response to such a compare operation, each CAM entry (102-0 to 102-n) can provide a match indication (MATCH0–MATCHn). A match indication can indicate if a stored data value matches or does not match an applied comparand value. A CAM entry (102-0 to 102-n) can receive an applied comparand value by way of a comparand bus 104.

The first embodiment 100 can further include status stores 106-0 to 106-n associated with entries 102-0 to 102-n, respectively. Each status store (106-0 to 106-n) can store status information of its associated entry. In particular, each status store (106-0 to 106-n) can store at least one bit that indicates whether or not its associated entry stores valid data or not.

The first embodiment 100 is shown to further include a switching circuit 108. A switching circuit 108 can receive match indications (MATCH0–MATCHn) from entries 102-0 to 102-n and status information from status stores 106-0 to 106-n. The switching circuit 108 can also receive mode information, shown as MODE. MODE information can place switching circuit 108 into a number of different modes, including at least a "compare" mode and a "learn" mode.

In a compare mode, a switching circuit 108 can provide match indications MATCH0–MATCHn on switch outputs SW0–SWn, respectively. However, in a learn mode, switching circuit 108 can provide the complement of status information from status stores 106-0 to 106-n on the switch outputs (SW0–SWn). The CAM may then "learn" the next free address from the status information.

In this way, the first embodiment 100 can include a number of output nodes (such as switch outputs SW0–SWn) that can provide match indications in one mode and entry status information in another mode.

Figure 2:
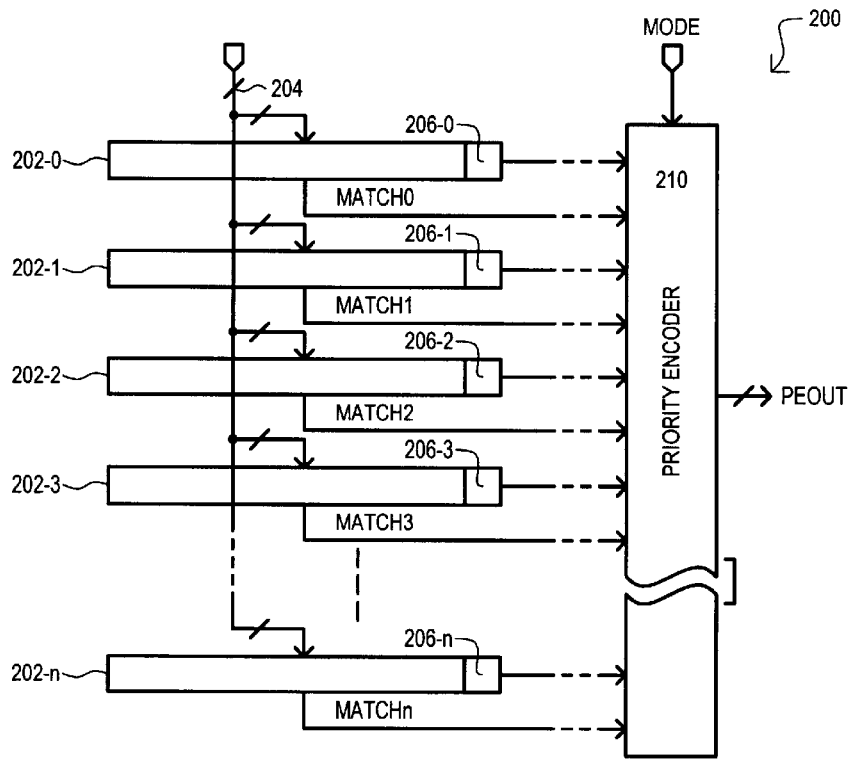
FIG. 2 is a block schematic diagram of a second embodiment.

Referring now to FIG. 2, a second embodiment is set forth in a block schematic diagram and designated by the general reference character 200. The second embodiment 200 can have many of the same constituents as the first embodiment 100. To that extent, like constituents will be referred to by the same reference character, but with the first character being a 2 instead of a 1. Thus, FIG. 2 includes entries 202-0 to 202-n, comparand bus 204, and status stores 206-0 to 206-n.

The second embodiment 200 further includes a priority encoder 210. A priority encoder 210 can receive match indications MATCH0–MATCHn from the entries (202-0 to 202-n) and complementary status information from status stores 206-0 to 206-n. A priority encoder 210 can provide a number of priority encoder outputs PEOUT. A priority encoder 210 can prioritize match indications (MATCH0–MATCHn) as well as status information.

As just one example, the priority encoder 210 can provide a priority encoder output that corresponds to each match indication (MATCH0–MATCHn). If more than one of the match indications (MATCH0–MATCHn) is active, the priority encoder 210 can activate one of the priority encoder outputs according to predetermined criteria, such as entry position in the CAM. The priority encoder 210 can also provide a priority encoder output that corresponds to each entry (202-0 to 202-n). If the status information in the status stores (206-0 to 206-n) indicates that more than one entry (202-0 to 202-n) contains invalid data, the priority encoder 210 can activate one of the priority encoder outputs according to predetermined criteria, such as entry position in the CAM.

It is understood that match indications (MATCH0–MATCHn) and status information can be applied to the priority encoder 210 by various other intervening circuits.

In this way, the second embodiment 200 can include a priority encoder that determines priority among multiple active match indications, as well as among entries that store invalid data.

Figure 3:
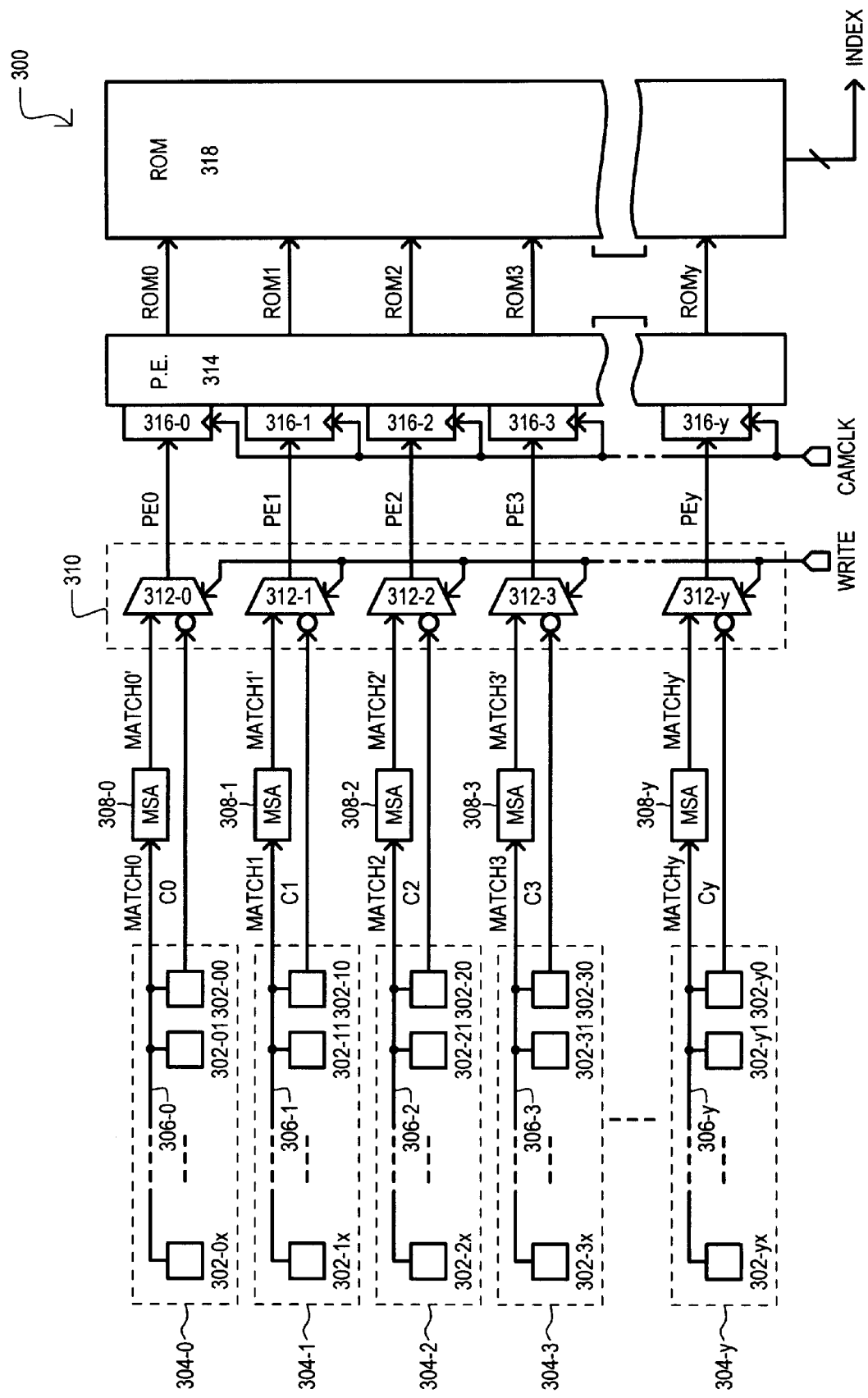
FIG. 3 is a schematic diagram of a third embodiment.

Referring now to FIG. 3, a third embodiment is set forth in a schematic diagram and designated by the general reference character 300. The third embodiment 300 may include a number of CAM cells identified as 302-yx, where y can indicate a particular row and x can indicate a particular column. In the particular arrangement of FIG. 3, CAM cells of the same row can belong to the same entry 304-0 to 304-y. Each entry (304-0 to 304-y) can provide a match indication MATCH0–MATCHy and at least one corresponding status bit C0–Cy.

The CAM cells of an entry (304-0 to 304-y) can store data for comparison with a comparand value. In addition, at least one CAM cell of an entry can store status information. In the particular arrangement of FIG. 3, CAM cells of column 0 can each store a status bit. A status bit of logic value "0" can indicate that data stored in the entry is invalid. A status bit of logic value "1" can indicate that data stored in the entry is valid. A data value that is to be compared with a search key can be stored in the remaining bits of each entry (304-0 to 304-Y).

Match indications MATCH0–MATCHy can be generated on match lines 306-0 to 306-y, respectively. In one particular arrangement, a match line (306-0 to 306-y) may be precharged (or predischarged) to one potential. In the event an applied comparand value matches the data values stored in an entry (304-0 to 304-y) the match line of the entry can remain precharged (or predischarged). However, if the data in any of the CAM cells of an entry (304-0 to 304-y) does not match an applied comparand value, the match line of the entry can begin to discharge (or charge). The bits of a comparand value can be applied by way of comparand lines (not shown) that can be commonly coupled to CAM cells of the same column.

As shown in FIG. 3, a CAM cell that stores status information includes a status bit output (shown as C0–Cy). A status bit output may be used to indicate whether an entry (304-0 to 304-y) stores valid data or not. It is understood that the inverse of this information can indicate those entries (304-0 to 304-y) that do not store data. According the arrangement of FIG. 3, inverse status information is prioritized to provide a "next" free address.

Each match line (306-0 to 306-y) can be connected to a match sense amplifier (308-0 to 308-y). A match sense amplifier (308-0 to 308-y) can detect a voltage change on its corresponding match line, and generate a match indication output (MATCH0'–MATCHy'). The third embodiment further includes a "learn" multiplexer (MUX) circuit 310. A learn MUX circuit 310 can receive match indication outputs (MATCH0'–MATCHy') as well as status bit outputs (C0–Cy). The learn MUX circuit 310 provides a number of MUX outputs, shown as PE0–PEy, that can vary according to a particular mode of operation. For example, in a compare operation, MUX outputs (PE0–PEy) can correspond to match indication outputs (MATCH0'–MATCHy'). In a write operation, MUX outputs (PE0–PEy) can correspond to status bit outputs (C0–Cy).

The particular learn MUX circuit 310 of FIG. 3 is shown to include a number of two input MUXs, shown as items 312-0 to 312-y. One input of each MUX can receive a match indication output, while another input of each MUX can receive a status bit output C0–Cy. The status bit outputs (C0–Cy) are inverted at their respective MUX inputs. The MUXs (312-0 to 312-y) are commonly controlled by a write signal WRITE.

When the WRITE signal is inactive, each MUX (312-0 to 312-y) can provide a match indication output as a MUX output. In particular, match indication outputs MATCH0' to MATCHy' can be provided as MUX outputs PE0 to PEy, respectively.

When the write signal is active, each MUX (312-0 to 312-y) can provide a status bit output as a MUX output. In particular, the complement of status bit outputs C0 to Cy can be provided as MUX outputs PE0 to PEy, respectively.

A priority encoder 314 can receive the MUX outputs PE0 to PEy and prioritize those that are active according to predetermined criteria. Such predetermined criteria can include entry location. Accordingly, in a non-write mode, the priority encoder will activate an encoder output signal (shown as ROM0 to ROMy) corresponding to the lowest entry having an active match indication output. In addition, in a write mode, the priority encoder will activate an encoder output signal (shown as ROM0 to ROMy) corresponding to the lowest entry having an "invalid" status bit. In this way, the "next free" address can be learned.

In the arrangement of FIG. 3, the priority encoder 314 latches MUX outputs PE0 to PEy into corresponding registers 316-0 to 316-y according to a clock signal CAMCLK.

The encoder output signals (ROM0 to ROMy) can be supplied to a read-only-memory (ROM) 318. A ROM 318 can store a number of index values that are generated in response to the activation of particular encoder output signals (ROM0 to ROMy). An index output value is shown as INDEX.

Figure 4A:
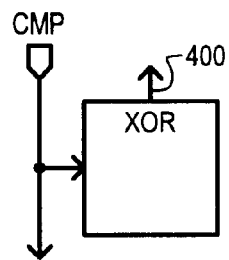
FIGS. 4A–4D are examples of content addressable memory cells that may be used in the various embodiments.

FIG. 4A is an example of a CAM cell that may store a data bit for comparison with a comparand bit (CMP) presented on one or more comparand lines. The CAM cell of FIG. 4A may include a compare type output 400. A compare type output can provide a comparison between a comparand bit and a stored data value bit. As but two examples, a compare type output can indicate an exclusive OR (XOR) or exclusive NOR (XNOR) type comparison. A CAM cell such as that set forth in FIG. 4A could be used in columns x through 1 in the embodiment of FIG. 3.

Figure 4B:
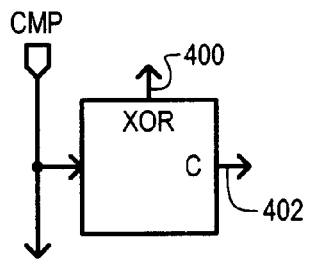

FIG. 4B is an example of a CAM cell that may store a status bit for an entry. The CAM cell of FIG. 4B may include a compare type output 400, like that of FIG. 4A. In addition, the CAM cell also includes a status bit output 402.

Figure 4C:
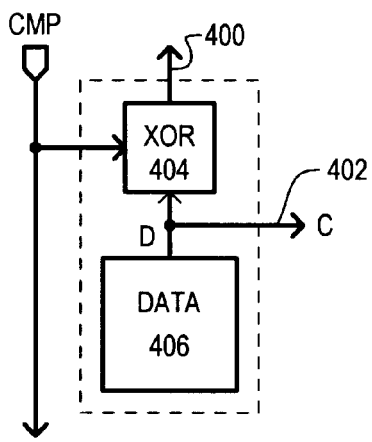

FIG. 4C is an example of a binary CAM cell that may store a status bit. The binary CAM cell includes a compare type output 400 and a status bit output 402. The CAM cell of FIG. 4C includes a compare circuit 404 and a data store 406. The compare circuit 404 can compare a comparand bit (CMP) and a data value bit (D). Such a compare circuit 404 can include an XOR or XNOR circuit, as but two of the many possible examples. That data store 406, in addition to providing a data value (D) to the compare circuit 404, can also provide the data value as a status bit output (C).

Figure 4D:
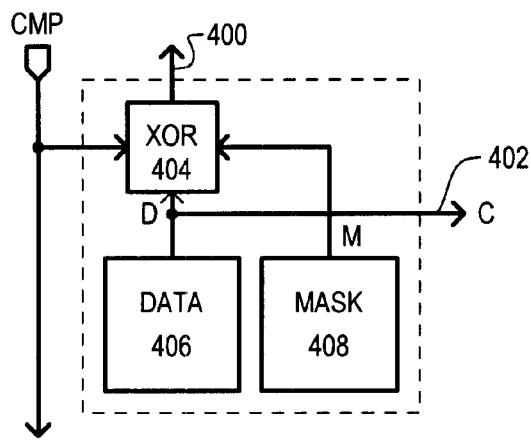

FIG. 4D is an example of a ternary CAM cell that may store a status bit. The ternary CAM cell includes compare type output 400 and a status bit output 402. The ternary CAM cell of FIG. 4D includes a compare circuit 404 and a data store 406, like the binary CAM cell of FIG. 4C. The ternary CAM cell further includes a mask store 408 that can store a mask bit. A mask bit enables a compare operation by a compare circuit 404 to be masked. That is, if the mask bit (M) is valid, compare circuit 404 will indicate a match whether the comparand bit CMP and data bit D are different or not.

It is understood that while the various examples of FIGS. 4A to 4D illustrate CAM cells coupled to a single comparand line, such CAM cells could also be coupled to complementary comparand lines.

Figure 5:
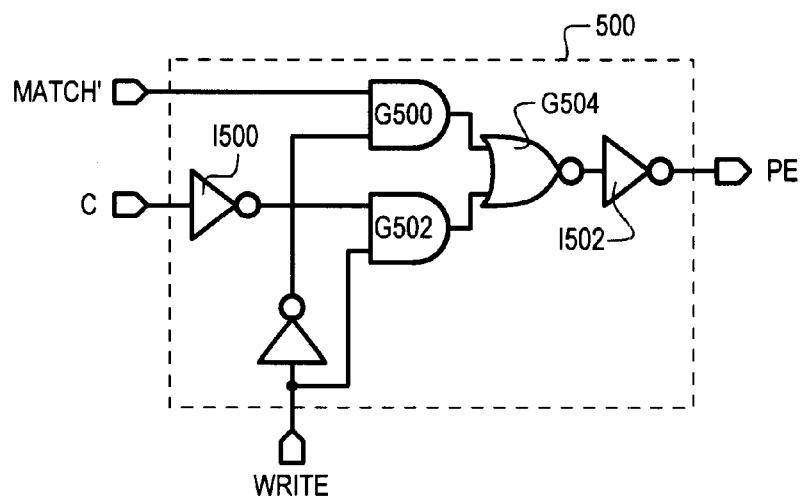
FIG. 5 is a schematic diagram of one example of a MUX that may be used in the third embodiment.

Referring now to FIG. 5, an example of a MUX is set forth in a schematic diagram, and designated by the general reference character 500. The particular MUX 500 of FIG. 5 includes a first two input AND gate G500 having one input that receives a match indication output MATCH' and another input that receives an inverted WRITE signal. A second AND gate G502 has one input that receives a status bit output C by way of an inverter I500 and another input that receives a WRITE signal. The outputs of gates G500 and G502 are provided as inputs to a two input NOR gate G504. The output of NOR gate G504 is inverted by inverter 1502. The output of inverter 1502 can provide a MUX output PE.

In the arrangement of FIG. 5, when the WRITE signal is inactive (low in this particular example), gate G500 is enabled and gate G502 is disabled. The output of gate G500 follows the MATCH' output value while the output of gate G502 is forced low. Gate G504 and inverter 1502 logically OR the outputs of gates G502 and G500, thus the MUX output PE follows the MATCH' output value. When the WRITE signal is active (high in this case), gate G502 is enabled and gate G500 is disabled. The output of gate G502 follows the inverse of the C value while the output of gate G500 is forced low. Consequently, the MUX output PE follows the inverse C value.

Priority encoders are well understood in the art. Some of the many approaches to forming priority encoders is set forth in commonly owned co-pending U.S. patent application Ser. No. 09/272,710 entitled PRIORITY SELECTION CIRCUIT, the contents of which are incorporated by reference herein.

Figures 6, 7A, 7B, 8:
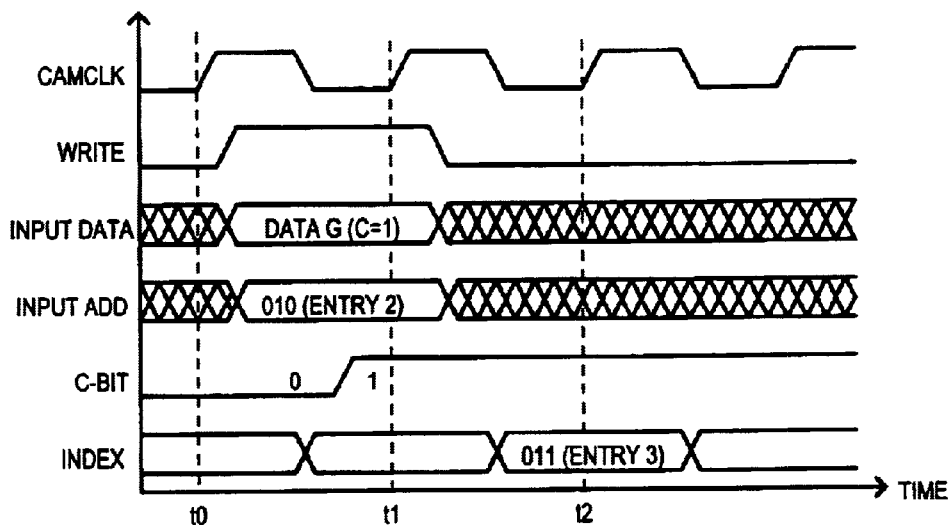
FIG. 6 is a timing diagram illustrating the operation of a write operation in the third embodiment.
FIGS. 7A and 7B are diagrams illustrating the write operation of FIG. 6.
FIG. 8 is a block schematic diagram of a conventional content addressable memory having entries with a status bit.

Having described various embodiments of the present invention, a write operation of the third embodiment 300 will now be described. Referring now to FIG. 6, a timing diagram is set forth illustrating various signals and values of the third embodiment.

In particular, FIG. 6 shows a CAMCLK waveform that can be a timing signal for the third embodiment 300. The WRITE signal discussed in conjunction with FIG. 3 is also included. An INPUT DATA waveform illustrates a data value that is written into a particular CAM entry. An INPUT ADD waveform illustrates the address of the entry that the INPUT DATA is written into. A C-BIT waveform illustrates the status bit of an entry that is written into. An INDEX value waveform illustrates a resulting INDEX value generated by a ROM 316 of the third embodiment 300. Three time indicators are shown in FIG. 6, including a time t0, time t1 and a time t2.

FIGS. 7A and 7B set forth an example of eight CAM entries of a third embodiment 300. FIG. 7A shows the CAM entries at time t0. FIG. 7B shows the CAM entries at time t1. FIGS. 7A and 7B identify a CAM entry number column and a data column having a status bit, shown as C.

Referring now to FIG. 6 in conjunction with FIGS. 7A and 7B, a write operation of the third embodiment 300 will now be described. At time t0, the first eight entries of a CAM can include five entries that store "valid" data values (entries 000, 001, 100, 101 and 110) and three entries having "invalid" data values (entries 010, 011 and 111). It is assumed that lower numbered entries have a higher priority. Thus, at time t0, entry 010 is the "next free" address.

After time t0, the WRITE signal transitions high, beginning a write operation. Because entry 010 is the next free address, INPUT ADD will be "010," allowing data to be written into entry 010. The INPUT DATA to be written is shown as DATA G. The value DATA G will include a status bit C=1. Having the status bit C=1 can change the entry 010 from one that stores invalid data to one that stores valid data.

Waveform C-BIT shows how the status of bit of entry 010 changes form 0 to 1 as the DATA G value is written into entry 010.

At time t1, the DATA G value has been written into entry 010. Consequently, the C-bit corresponding to the entry 010 is a 1. Because the WRITE signal remains active (high in the particular example), a learn MUX circuit 310 can generate MUX outputs (PE0 to PEn) corresponding to the inverse of the entry C-bits. As shown in FIG. 7B, following the writing of the DATA G value into entry 010, entry 011 is now the next free address.

A priority encoder 314 can receive the inverse C-bits. At time t1 the CAMCLK signal transitions high, thus the inverse C-bits are latched within the priority encoder 314. Those inverse C-bits that are active (indicate an invalid entry) are prioritized. For the arrangement of FIG. 7B, inverse C-bits for entries 011 and 111 are prioritized, resulting in an encoder output value corresponding to entry 011 being activated.

The activated encoder output can be applied to ROM 316. In response, ROM 316 can generate an index value corresponding to entry 011. In the particular example of FIGS. 6, 7A and 7B, the resulting INDEX is the next free address. Thus, at time t2, the INDEX value is "011."

It is noted that an applied comparand value can be an "entire" comparand value, or a portion of a comparand value.

It is also noted that while the particular embodiment of FIG. 3 includes entries formed from a row of CAM cells, entries could include multiple such rows. Further, while status bits in FIG. 3 are shown to be stored in a CAM cell in the same row as their corresponding entry, this should not be construed as limiting to the invention. Alternate embodiments may include status bits stored elsewhere that utilize the same priority encoder as match indications.

It is understood that a match indication can include an exact match between all bits of a comparand value and those of a data value, or a "masked" match between the bits of a comparand value and a masked data value.

It is further understood that while the various examples have described encoders that determine priority according to entry order, other priority criteria may be used for match indications and/or next free address determination. Further, a priority encoder may provide one type of priority for match indications and a different priority for next free address determination.

Still further, it is understood that while a mode of operation has been described in which a next free address can be provided after a write operation, other operations could access a next free address, independent of any write operation.

Thus, while the preferred embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM), comprising:
   a plurality of entries that store data values, each entry generating a match indication in response to a comparison between a comparand value and its data value and including a plurality of CAM cells, at least one CAM cell of the entry storing a status indication associated with the entry;

a the status indication associated with each entry indicates if the entry stores valid or invalid data; and a priority encoder that prioritizes match indications and status indications.

2. The CAM of claim 1, wherein:

the priority encoder includes a plurality of priority encoder outputs, each priority encoder output providing at least one prioritized match indication in one mode and at least one prioritized status indication in another mode.

3. The CAM of claim 2, wherein:

data values are written into at least one of the entries in a write mode; and the priority encoder provides the at least one prioritized status indication in the write mode.

4. The CAM of claim 1, wherein;

the data value stored in each entry can include a plurality of bits, at least one bit providing the status indication associated with the entry.

5. The CAM of claim 1, wherein:

the CAM cells include ternary CAM cells.

6. The CAM of claim 1, wherein:

the CAM cells include binary CAM cells.

7. The CAM of claim 1, further including:

a switch circuit disposed between the entries and the priority encoder, the switch circuit switching match indications to the priority encoder in one mode and switching status indications to the priority encoder in another mode.

8. A method of operating a content addressable memory (CAM), comprising the steps of:

storing data values in a number of entries;

storing a status indication corresponding to each entry that indicates a valid or invalid status for the entry;

in a compare mode, comparing a comparand value to data values and generating a number of match indications, and applying the match indications to a priority encoder, the comparand value including a status portion that is compared to the status indications corresponding to the data values; and in a find next free mode, applying the status indications to the priority encoder.

9. The method of claim 8, wherein:

the step of comparing a comparand value to data values includes generating mismatch indications for entries that indicate an invalid status.

10. The method of claim 8, further including:

in the find next free mode, supplying prioritized status indications to a read-only-memory and generating an index value corresponding to the entry of the highest priority status indication.

11. The method of claim 10, further including:

in a compare mode, supplying prioritized match indications to the read-only-memory and generating an index value corresponding to the entry of the highest priority match indication.

12. A content addressable memory (CAM), comprising:

a plurality of entries that store data values for comparison to comparand values, each entry including status data that indicates if the entry stores valid data, and generating a match indication in response to a comparison between a comparand value and valid data, and each entry including a plurality of CAM cells, at least one of the CAM cells storing status information and providing status data; and a switch circuit that couples match indications to witch outputs in one mode, and couples status data to the switch outputs in another mode; and a priority encoder coupled to the switch outputs that prioritizes match indications in the one mode and prioritizes status data in the other mode.

13. The CAM of claim 12, wherein:

the CAM cells of the same entry are commonly coupled to a match line that provides a match indication.

14. The CAM of claim 12, wherein:

the CAM includes a plurality of CAM cells arranged into rows and columns, the CAM cells of the same entry being in the same row.

15. The CAM of clam 12, wherein:

the switch circuit includes a multiplexer circuit.

16. The CAM of claim 15, wherein:

the multiplexer circuit includes a plurality of multiplexers, each multiplexer having one input that receives a match indication of an entry and another input that receives status data for the same entry.

17. The CAM of claim 12, wherein:

the CAM includes a first mode; and the switch circuit couples status data to the switch outputs in the first mode.

18. The CAM of claim 17, wherein:

the first mode is a write mode.

* * * * *